United States Patent
Hardy et al.

(10) Patent No.: US 7,809,423 B2
(45) Date of Patent: Oct. 5, 2010

(54) ROBUST CORONARY MR ANGIOGRAPHY MR WITHOUT RESPIRATORY NAVIGATION

(75) Inventors: Christopher Judson Hardy, Schenectady, NY (US); Manojkumar Saranathan, Rockville, MD (US)

(73) Assignee: General Electric Company, Niskayuna, NY (US)

( * ) Notice: Subject to any disclaimer, the term of this patent is extended or adjusted under 35 U.S.C. 154(b) by 915 days.

(21) Appl. No.: 11/246,725

(22) Filed: Oct. 6, 2005

(65) Prior Publication Data

US 2006/0052688 A1 Mar. 9, 2006

Related U.S. Application Data

(62) Division of application No. 09/681,406, filed on Mar. 30, 2001, now Pat. No. 6,980,846.

(51) Int. Cl.
*A61B 5/05* (2006.01)
(52) U.S. Cl. .............. 600/410; 600/529; 600/587; 324/306; 324/307; 324/309
(58) Field of Classification Search .......... 600/410, 600/409, 529, 587
See application file for complete search history.

(56) References Cited

U.S. PATENT DOCUMENTS

| | | | |
|---|---|---|---|
| 4,727,882 A * | 3/1988 | Schneider et al. | 600/484 |
| 5,396,418 A * | 3/1995 | Heuscher | 378/15 |
| 5,419,325 A * | 5/1995 | Dumoulin et al. | 600/410 |
| 5,492,123 A * | 2/1996 | Edelman | 600/410 |
| 5,604,434 A * | 2/1997 | Schomberg | 324/309 |
| 5,650,723 A * | 7/1997 | Meyer | 324/309 |
| 6,045,514 A * | 4/2000 | Raviv et al. | 600/529 |
| 6,067,465 A | 5/2000 | Foo et al. | 600/410 |
| 6,088,488 A | 7/2000 | Hardy et al. | 382/278 |
| 6,144,874 A | 11/2000 | Du | 600/413 |

OTHER PUBLICATIONS

Gary H. Glover, S. Lai, "Self-Navigated Spiral fMRI: Interleaved versus Single-Shot", MRM 39:361-368 (1998), Stanford University School of Medicine, Center for Advanced MR Technology at Stanford, Dept. of Diagnostic Radiology, Stanford, CA.

\* cited by examiner

*Primary Examiner*—Long V Le
*Assistant Examiner*—Joel F Brutus
(74) *Attorney, Agent, or Firm*—Jason K. Klindtworth (57) ABSTRACT

A method for acquiring image data from a subject during a scan with a Magnetic Resonance Imaging (MRI) system comprising the steps of acquiring a reference data set of a region of interest, acquiring a plurality of free-breathing data sets, and, selectively processing the plurality of free-breathing data sets in comparison with the reference data set to be used in creating an image of the region of interest. The reference data set comprises breath-held data set or, alternatively, free-breathing data.

13 Claims, 8 Drawing Sheets

ROBUST CORONARY MR ANGIOGRAPHY MR WITHOUT RESPIRATORY NAVIGATION

CROSS REFERENCE TO RELATED APPLICATIONS

This application is a Division of application Ser. No. 09/681,406, filed Mar. 30, 2001, now U.S. Pat. No. 6,980,846 entitled, "ROBUST CORONARY MR ANGIOGRAPHY WITHOUT RESPIRATORY NAVIGATION."

BACKGROUND OF INVENTION LABEL NUMBER

This invention relates generally to medical imaging methods. More particularly, the invention relates to image data acquisition for Magnetic Resonance (MR) angiography using a Magnetic Resonance Imaging (MRI) system.

MR coronary angiography offers the potential for a totally noninvasive exam which could detect and characterize lesions in the coronary arteries, thus allowing the avoidance of diagnostic X-ray catheterization in a large number of patients who currently receive this exam. In order to avoid blurring and ghosting in the MR images due to respiratory motion, Echocardiogram (ECG)-gated MR coronary angiography has typically been performed using either breath-held two-dimensional (2D) techniques or respiratory-gated three-dimensional (3D) techniques. Repeated breath holding is not feasible in a significant percentage of coronary patients and often leads to misregistration artifacts. Respiratory gating has been performed using navigator-echo gating techniques, where, interleaved with the imaging acquisition, a column of magnetization is excited running through the diaphragm, and data are acquired in the presence of a readout gradient oriented along the column axis. A one-dimensional Fourier transform of the data yields the position of the diaphragm as a function of time, which is then used either to trigger the acquisition of new coronary imaging data, or to reacquire data collected while the heart was mispositioned, or to acquire data with slice and/or phase shifts which track the motion of the heart. This technique, however, has not provided a robust method that works over a range of different breathing patterns in a variety of patients. Moreover, the displacement of the coronary arteries with respiration has been shown to differ from the displacement of the diaphragm, by varying amounts in different subjects, making the diaphragm a poor marker for cardiac positional information. Spiral navigation techniques replace the column excitation with a spiral trajectory, and have been used to detect translations and rotations in the collected images in the context of head imaging. Corrections can then be applied to the images by adjusting the phase or center position of the k-space, or time-domain, images. However, these techniques are not readily adapted to the heart, where significant through-plane motion and deformation are occurring as well as in-plane motion. An adaptive averaging technique, where frames of data where the coronary artery is visible are averaged after translation using cross-correlation algorithms, provides coronary imaging capabilities without breath holding or ECG gating, however image resolution is not optimal with this technique. Therefore a robust free-breathing technique is needed for coronary MRI which directly monitors the position of the vessels without extended breath-holding, and which produces high-resolution images.

BRIEF SUMMARY OF THE INVENTION

A method for acquiring image data from a subject during a scan with a Magnetic Resonance Imaging (MRI) system comprises the steps of acquiring a reference data set of a region of interest, acquiring a plurality of free-breathing data sets, and, selectively processing the plurality of free-breathing data sets in comparison with the reference data set to be used in creating an image of the region of interest.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
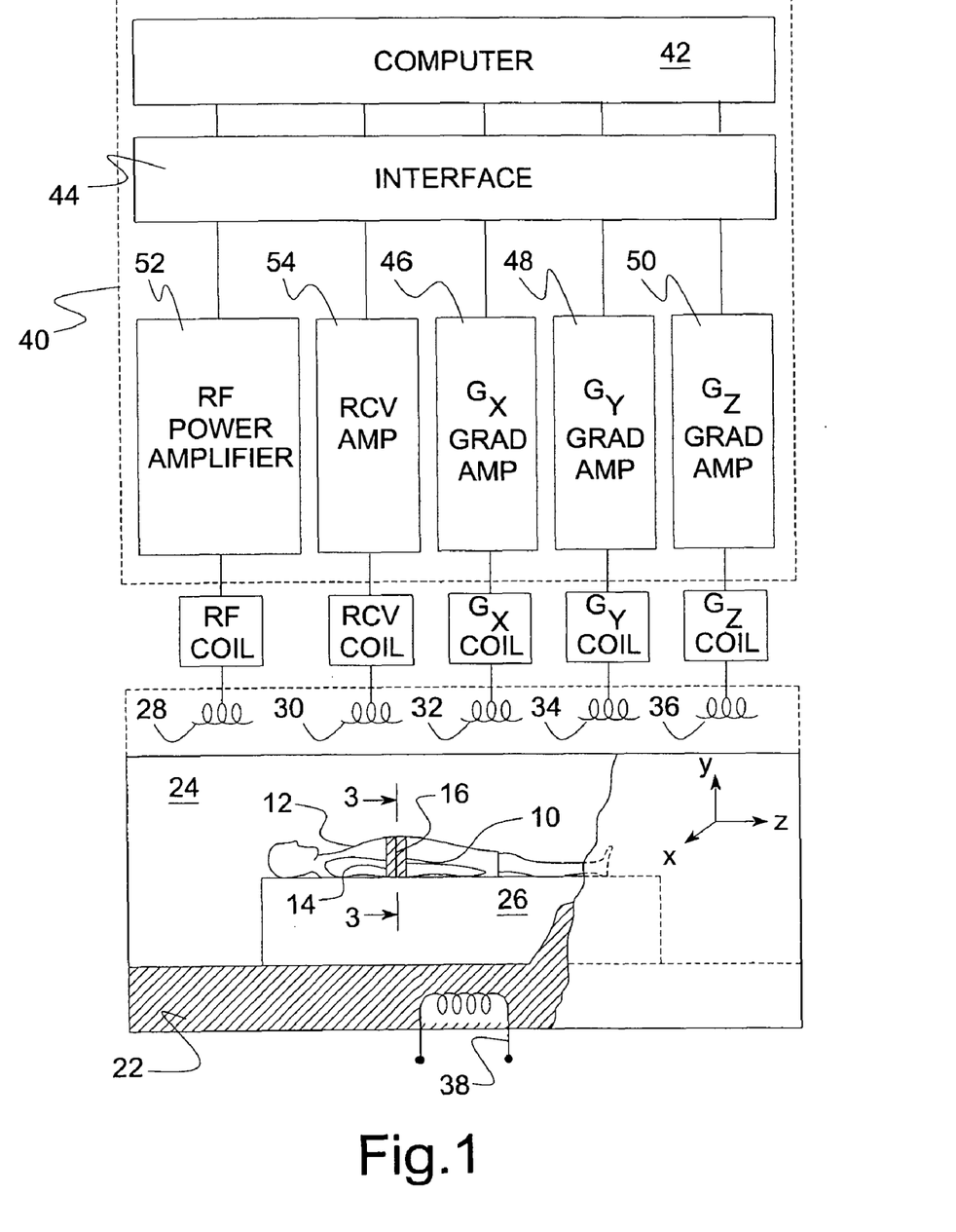
FIG. 1 is a diagram showing the components of a Magnetic Resonance Imaging (MRI) system for use in connection with embodiments of the invention.

FIG. 1 shows principal components of a MR imaging system 20, useful for practicing respective embodiments of the invention described hereinafter. System 20 includes a main magnet 22 provided with a bore 24, the MR subject 12 positioned therein on a support 26 for MR imaging of the patient structure 14. MR system 20 further includes a radio frequency (RF) excitation coil 28, a receive coil 30, $G_x$, $G_y$, and $G_z$ gradient coils 32, 34, and 36, respectively, and a static main magnet coil 38. All of the coils 28 and 32-38 are incorporated into magnet 22 so that when energized, they project respective magnetic fields into bore 24, and more specifically into region 10 of the subject 12. Receive coil 30 is likewise incorporated into magnet 22, to acquire M data points or samples.

Referring further to FIG. 1, there is shown MR system 20 further comprising system electronics 40, which include a computer 42 interactively coupled to an interface 44. Components of MR systems 20 further include gradient amplifiers 46, 48, and 50, which are each coupled to computer 42, through interface 44, and respectively energize the $G_x$, $G_y$, and $G_z$ gradient coils 32, 24, and 36. Thus computer 42, through gradient amplifiers 46 and 48, drives the $G_x$ and $G_y$ gradient coils to generate an oscillating read gradient which comprises the combined effects of gradient waveforms $G_x$ and $G_y$ after time TE (echo time), to perform spiral scanning. Spiral scanning, generally, samples k-space along a spiral trajectory in a known manner. To initiate a spiral scanning sequence, an operator (not shown), through interface 44, enters spiral pulse sequence parameters such as, for example, number of points, arms, and field of view (FOV). As is well-known, spiral parameters are selected depending on the image requirements such as, for example, resolution. The trajectory samples data in k-space, and then the data samples are interpolated into a rectilinear grid and transformed by Fourier transform to constitute MR image data samples. System electronics 40 further include an RF power amplifier 52, coupled to energize RF excitation coil 28 to produce the RF pulse, and receive amplifier 54, which amplifies respective MR data samples detected by receive coil 30, and couples them to computer 42.

As is also known, a single coil can be substituted for RF excitation coil 28 and receive coil 30. In such modification, a switching mechanism (not shown) is provided to alternately couple excitation amplifier 52 and receive amplifier 54 to such single coil. It is to be understood that system electronics 40 is likely to include other components that are not shown for the purpose of simplification.

Computer 42 is coupled to interface 44 to receive operator-defined spiral scanning parameters and generate a spiral trajectory for spiral scanning. Computer 42 is also configured to display the image, operator specified parameters if desired, and an indication of the resolution of the image. As used herein, "adapted to", "configured" and the like refer to computational devices (such as programmable computing devices and application specific integrated circuits, or the like), that are programmed with algorithms to provided a desired computation processing of signals applied to the device. The image data is acquired by sampling data at sample point locations along the spiral trajectory. Upon completion of data acquisition, computer 42 is configured to process (including transformation by Fourier transform) the acquired MR image data samples, to generate an image of structure 14, as viewed in the section or slice 16.

Figure 2:
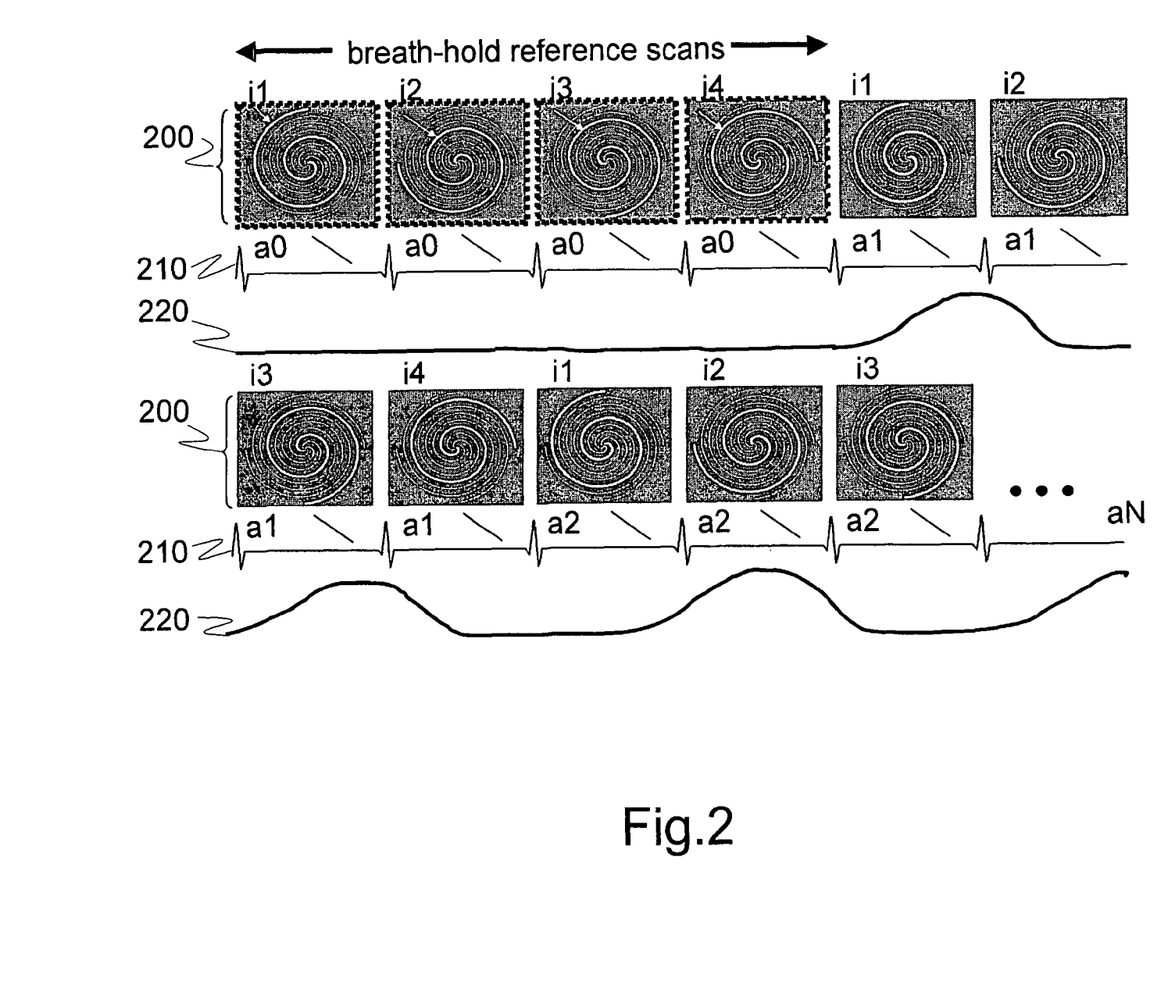
FIG. 2 is an illustration of a data acquisition scheme using interleaved spiral trajectories useful in embodiments of the present invention.

Referring to FIG. 2-6, embodiments of the present invention are now explained. Referring to FIG. 2, there is shown a series of interleaved spiral trajectories 200, each acquired for example, from an ECG-gated (210) fat-suppressed multi-slice spiral imaging technique in a well-known manner. FIG. 2 shows each spiral k-space trajectory 200 belonging to a family of 4 interleaves or arms i1-i4, at various acquisitions a0-aN contained within the ECG-gated intervals 210 during respiratory cycle 220, where a0 represents the reference acquisition and aN represents an acquisition number which is predetermined. Interleaves i1-i4 are each indicated as a thicker and brighter line in FIGS. 2 and 4. Respiratory cycle 220 is shown having a breath-holding interval at a0 and substantially periodic intervals after a1 during free-breathing. As used herein, an interleaf refers to an arm of a multi-arm spiral trajectory at a given interleaf angle of the multi-arm spiral trajectory. For each of the interleaf angles, there is a corresponding interleaf. Thus, a four-arm spiral trajectory will have four interleaf angles. Also, as used herein, an acquisition refers to the corresponding data, raw k-space or reconstructed, for each of the interleaves of a multi-arm spiral trajectory at a given instant. The trajectories 200 are shown as being of constant pitch originating from the center of k-space, also known as Archimidean spiral trajectories. It is to be appreciated that parameters for spiral trajectories in k-space, such as the number of arms or interleaves or predetermined number of acquisition intervals, are determined in accordance with selected criteria for image requirements, as well as the capabilities and limitations imposed by the MRI system. Typically the number of interleaves is in the range between about 16 and about 20, and the predetermined number of acquisition intervals N is in the range between about 9 and about 12. Thus, 16-20 interleaved spiral trajectories, such as the spiral trajectories 200 shown in FIG. 2, are traversed in k-space, one per heart cycle, with 4096 data points acquired during each interleaf. These data are then all interpolated onto a rectilinear grid, weighted, and Fourier transformed to produce an image. Because each interleaf requires only 30-40 ms to acquire, other slices can be acquired at other phases of the cardiac cycle, to produce a multi-slice data set. However, because between about 16 and about 20 heartbeats are required to produce a full and complete image, this method requires breath holding by the patient.

Figure 3:
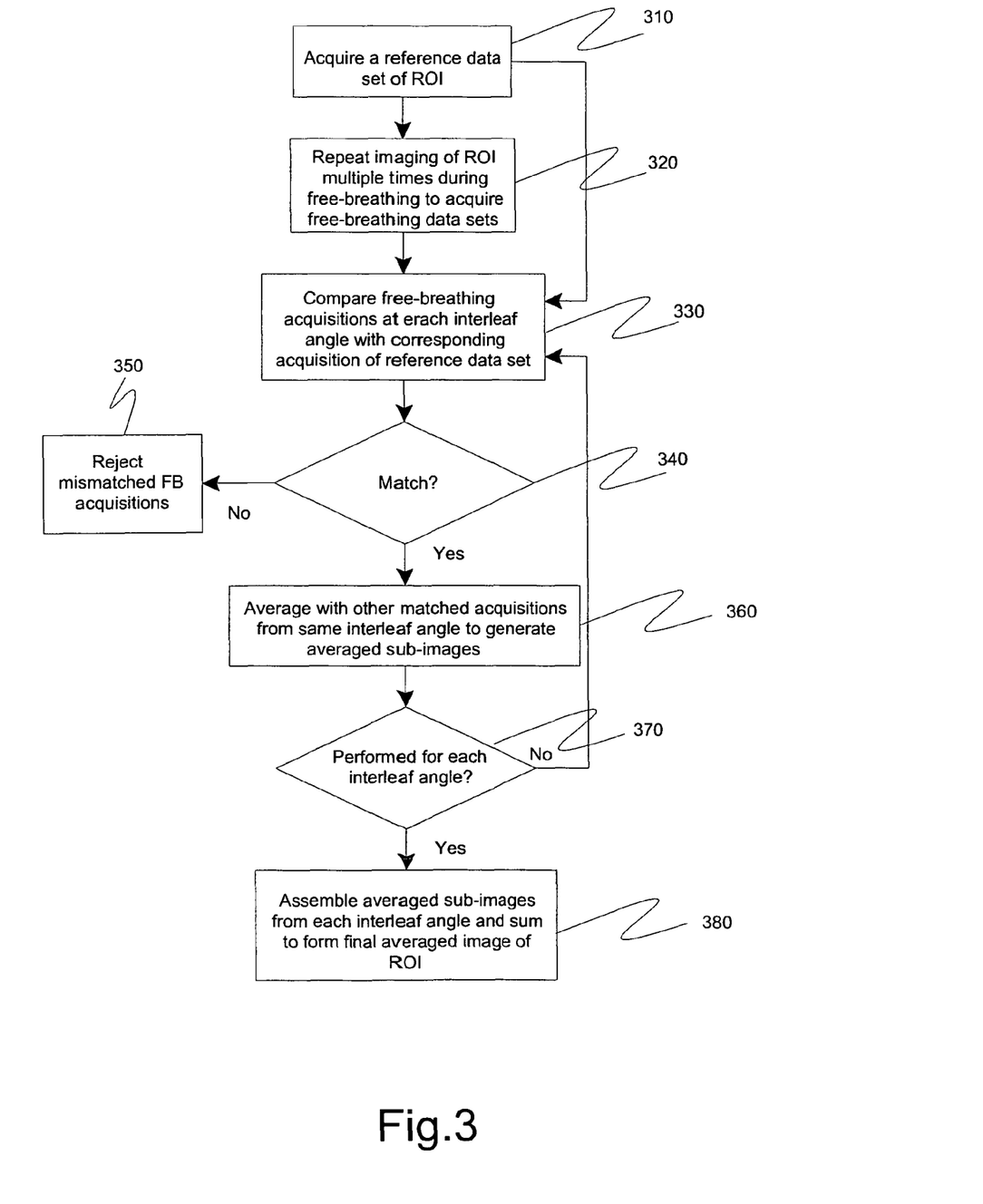
FIG. 3 is a block diagram illustrating embodiments of the present invention.

Referring to FIG. 3, a block diagram that illustrates embodiments of the present invention is shown. At step 310, a reference data set is acquired. In one embodiment, the reference data set is a single breath-held multi-slice data set of a region of interest in a given location that is acquired, desirably using ECG-gated interleaved spiral MRI, with spectral-spatial pulses to suppress body fat. Typically, the region of interest is a moving object such as the heart and, in particular, areas within the heart such as the coronary arteries or vessels. It is to be appreciated that the methods and embodiments of the present invention described herein are also applicable to other regions of interest which may be undergoing unwanted patient motion, such as the head or other internal organs. Typically, the reference data set comprises raw k-space data acquired during breath-holding. The breath-held acquisition interval is desirably no longer than 16 seconds. Alternatively, in another embodiment, the breath-held data set is reconstructed. Each spiral interleaf of the breath-held data set is reconstructed into a separate complex (in-phase and quadrature, or I and Q) image, hereinafter referred to as reference or breath-held "sub-images", to form a reference or cross-correlation kernel. Because each interleaf on its own samples k-space inadequately, it is to be appreciated that the sub-images have significant aliasing artifacts. However, if the complex sub-images corresponding to the different interleaves are all summed together, these artifacts cancel, and result in the equivalent image that would have obtained if the various interleaves were all gridded together prior to Fourier transformation. Alternatively, in yet another embodiment which will be discussed further with reference to FIGS. 6 and 7, the reference data set is acquired from a free-breathing data set which is adjusted to account for positional shift and other variances inherent in dynamic imaging. It is to be appreciated that in this embodiment, no breath-holding is required during imaging.

Referring further to FIG. 3, at step 320, imaging of the region of interest is repeated during free-breathing to acquire additional, free-breathing data sets of the region of interest. Desirably a range between about 9 to about 12 additional free-breathing data sets are acquired, but it is to be appreciated that the number of data sets is selected in accordance with signal-to-noise ratio and patient breathing pattern considerations.

In steps 330, 340 and 350 the free-breathing data sets are selectively processed to monitor the position of the region of interest during free-breathing data acquisition and to compare, sort and select from the free-breathing data sets relative to the reference data set in order to generate a final image of the region of interest.

Figure 4:
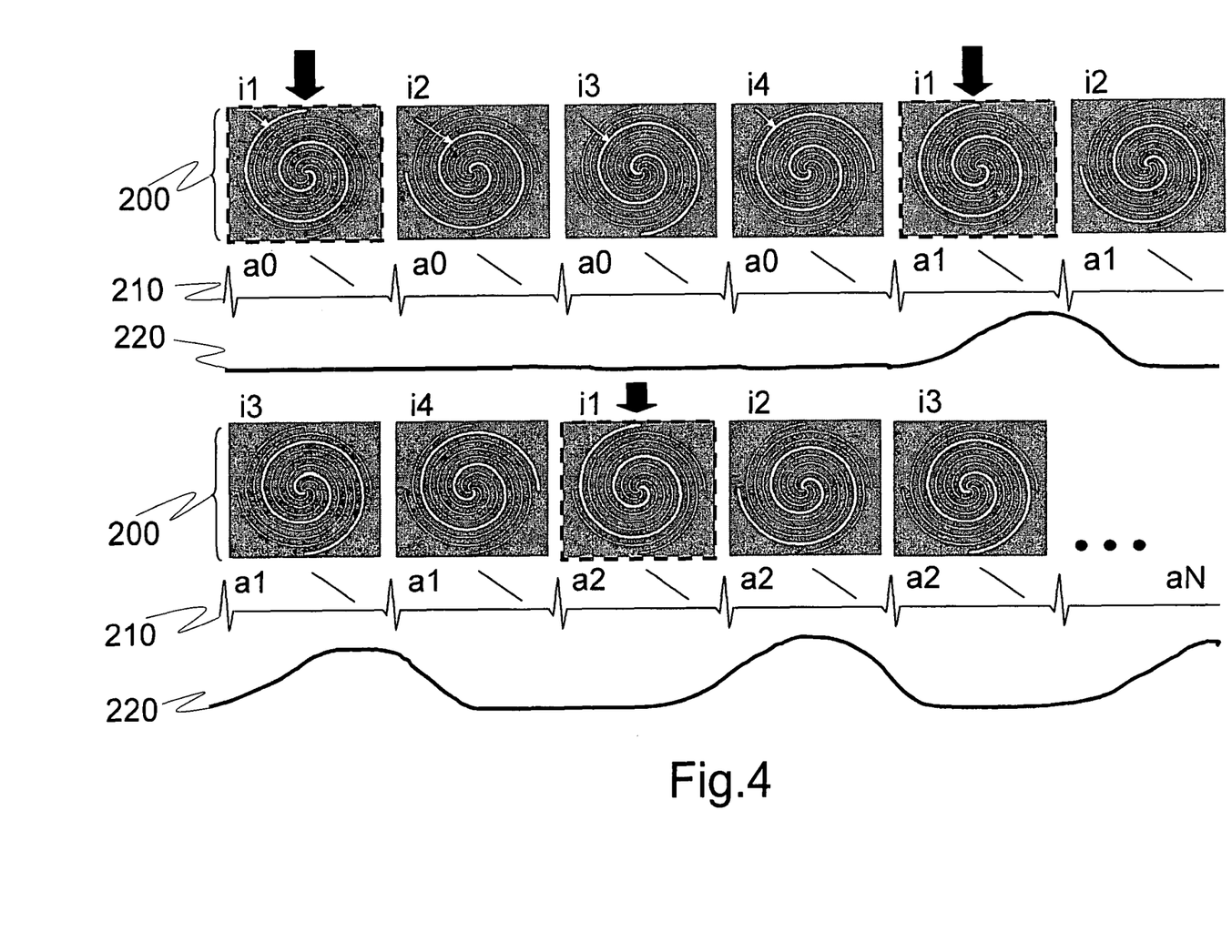
FIGS. 4 and 5 graphically illustrate acquisition and comparison schemes useful in embodiments of the present invention.
Figure 5:
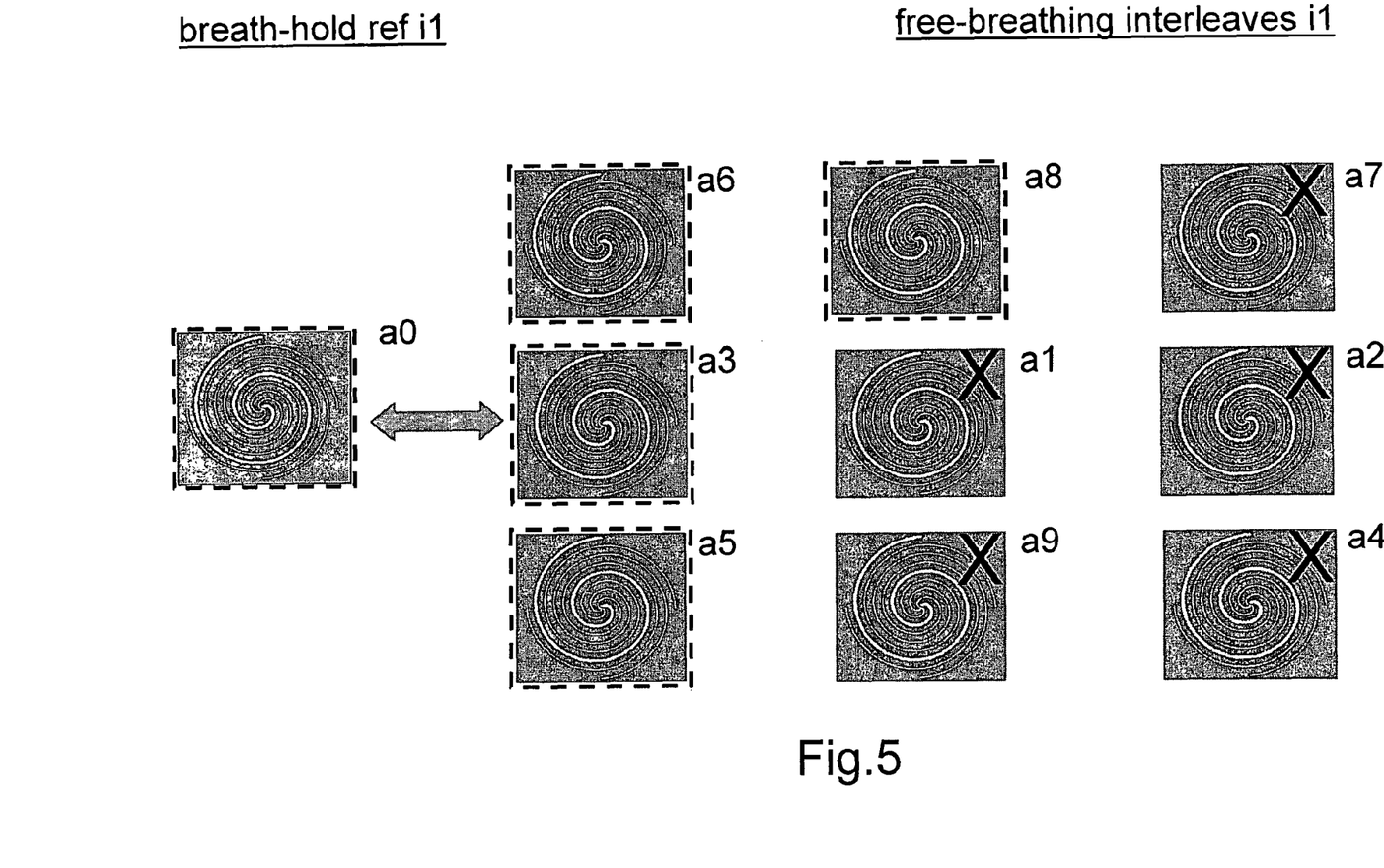

At step 330, each acquisition acquired during free-breathing is compared with a corresponding acquisition of the reference data set, which in this embodiment is the breath-held data set. In other words, at step 330, each interleaf for each of the free-breathing data sets is compared with the corresponding interleaf from the reference data set. Step 330 is best illustrated with reference to FIGS. 4 and 5. As shown in FIG. 4, the reference data set comprises interleaves i1-i4 acquired, for example during breath-holding, at acquisition a0. Thereafter, free-breathing data sets are acquired at acquisitions a1-aN. FIG. 5 illustrates comparison step 330 of FIG. 3 in which interleaf i1 for each of the free-breathing data sets is processed. Referring further to FIG. 5, each free-breathing interleaf for a given interleaf angle is compared with the corresponding interleaf from the reference data set. Thus, as shown in FIG. 5, i1 from acquisitions a1-aN are each compared, in accordance with methods to be described further, to interleaf i1 acquired during acquisition a0. The comparison is performed using either raw data k-space or, alternatively, reconstructed data. If the free-breathing data sets are to be reconstructed, then, as with the breath-held data set each respective interleaf of the free-breathing data sets is similarly reconstructed into a corresponding complex sub-image.

Referring further to FIGS. 3-5, the plurality of free-breathing interleaves at a given interleaf angle are compared with the corresponding reference interleaf at the same given interleaf angle to determine if there is a match (step 340) with the reference interleaf.

The comparison between the reference and free-breathing interleaves is desirably accomplished through use of the two-dimensional cross correlation. In an embodiment, a region of interest (ROI) is drawn around the feature of interest, e.g. the proximal right coronary artery, in each of the breath-held or reference sub-images in order to generate a set of cross-correlation kernels. The cross-correlation kernels are then cross-correlated with each of the corresponding free-breathing sub-images. In practice, the cross-correlation is desirably done by multiplication in the Fourier domain (by use of the correlation theorem) in order to speed up the computation by as much as several orders of magnitude. If the feature of interest is present in any of the free-breathing sub-images, then the cross-correlation will reveal a strong central peak. If the feature is present, but displaced in-plane, then the central peak will be likewise offset. If the feature has shifted out of plane, then the strong peak will be replaced by a more diffuse signal. At step 340, a match between the respective reference interleaf and free-breathing interleaves is determined according to the cross-correlation. Matched acquisitions are defined as interleaves from the free-breathing data set that cross-correlate or otherwise compare similarly to the corresponding interleaves of the reference data set at a given interleaf angle. Referring to FIG. 5, matched interleaves are highlighted with a dashed line corresponding to acquisition a6, a3, a5 and a8. Alternatively, it is to be appreciated that the comparison of step 330 of FIG. 3 is performed in accordance with other known techniques of ranking and sorting. An example of another techniques is calculation of the sum of the square of the difference between each complex point in the sub-images being compared.

Referring further to FIG. 3, step 350 rejects the free-breathing data acquisition if the comparison of step 330 does not produce a match as defined above. In particular, at step 350, if a given acquisition is shown not to contain the feature of interest, then it is rejected. The matched acquisitions are averaged with other matched acquisitions from the same interleaf angle at step 360 to generate a respective averaged sub-image for the interleaf angle. In other words, the matched acquisitions are used a basis for selective combination. Referring to FIG. 5, there is shown that four matched acquisitions are selected for averaging. In this manner, each free-breathing acquisition for a given interleaf angle is compared with the reference until a complete averaged sub-image is built up from the same respiratory phase. Then, the comparison process is repeated for each interleaf angle (step 370 determines if the comparison/match process described above at steps 330, 340 and 350 has been performed for each interleaf angle). At step 380, the averaged sub-images from each interleaf angle are assembled and summed to form a complete image of the region of interest. The number of matches is desirably a predetermined number in the range between about N/4 to about N/2. Alternatively, the number of matches needed for averaging is based on how closely correlated a free-breathing interleaf is relative to the corresponding reference interleaf. In this alternative embodiment, matched interleaves are selected in accordance with thresholds in the event that the predetermined number of matched interleaves cannot be found during the comparison process, which would then permit that an image be generated. In a further alternative embodiment, an over-sampled 16-interleaf data set is acquired over, for example, 128 heartbeats during free breathing. Then the cross-correlation is applied retrospectively to sort data from the same respiratory phase into a respiratory-gated image.

Figure 6:
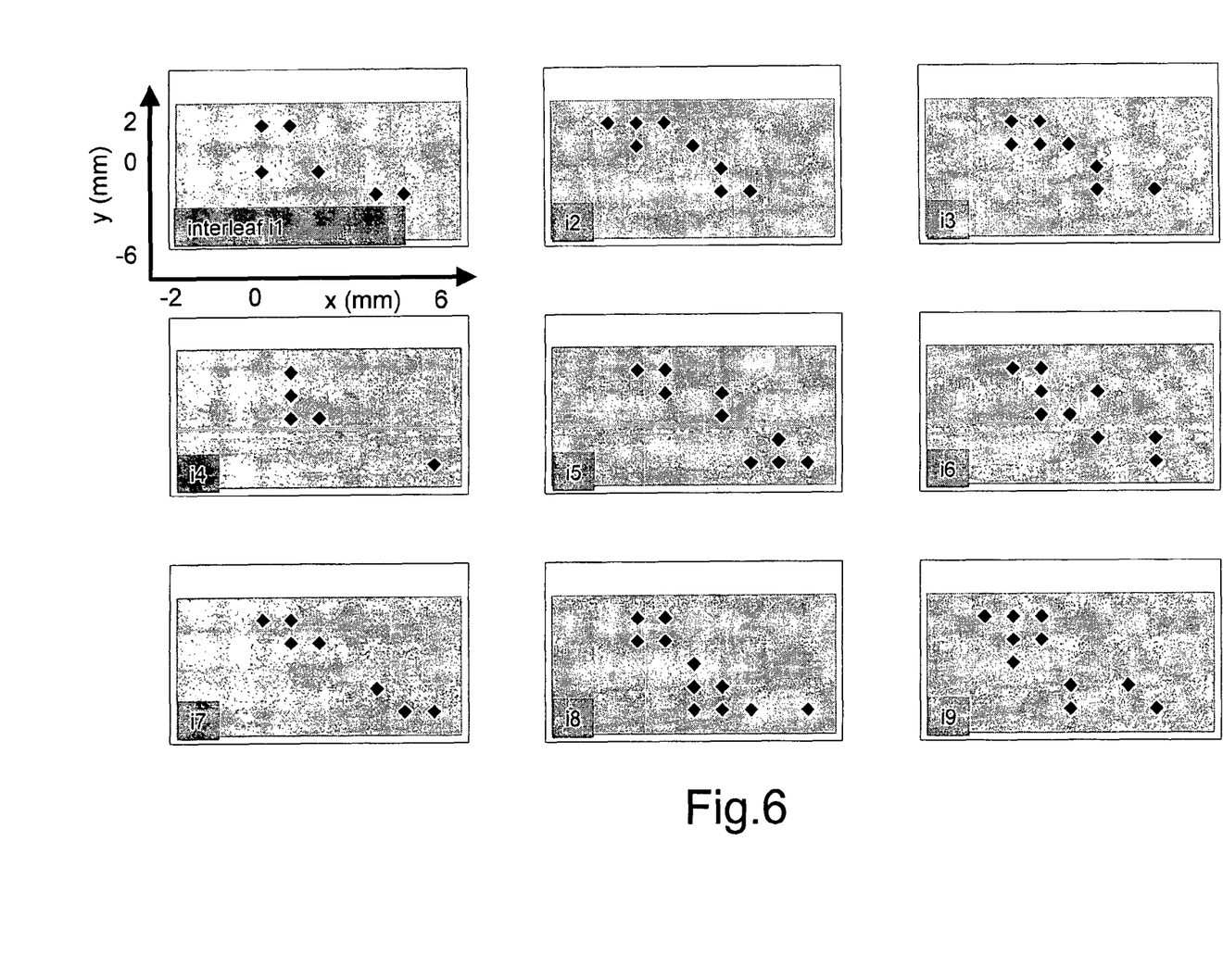
FIGS. 6 and 7 graphically illustrate free-breathing comparison schemes useful in further embodiments of the present invention; and, FIG. 8 is an illustration of a modified spiral trajectory useful in embodiments of the present invention.
Figure 7:
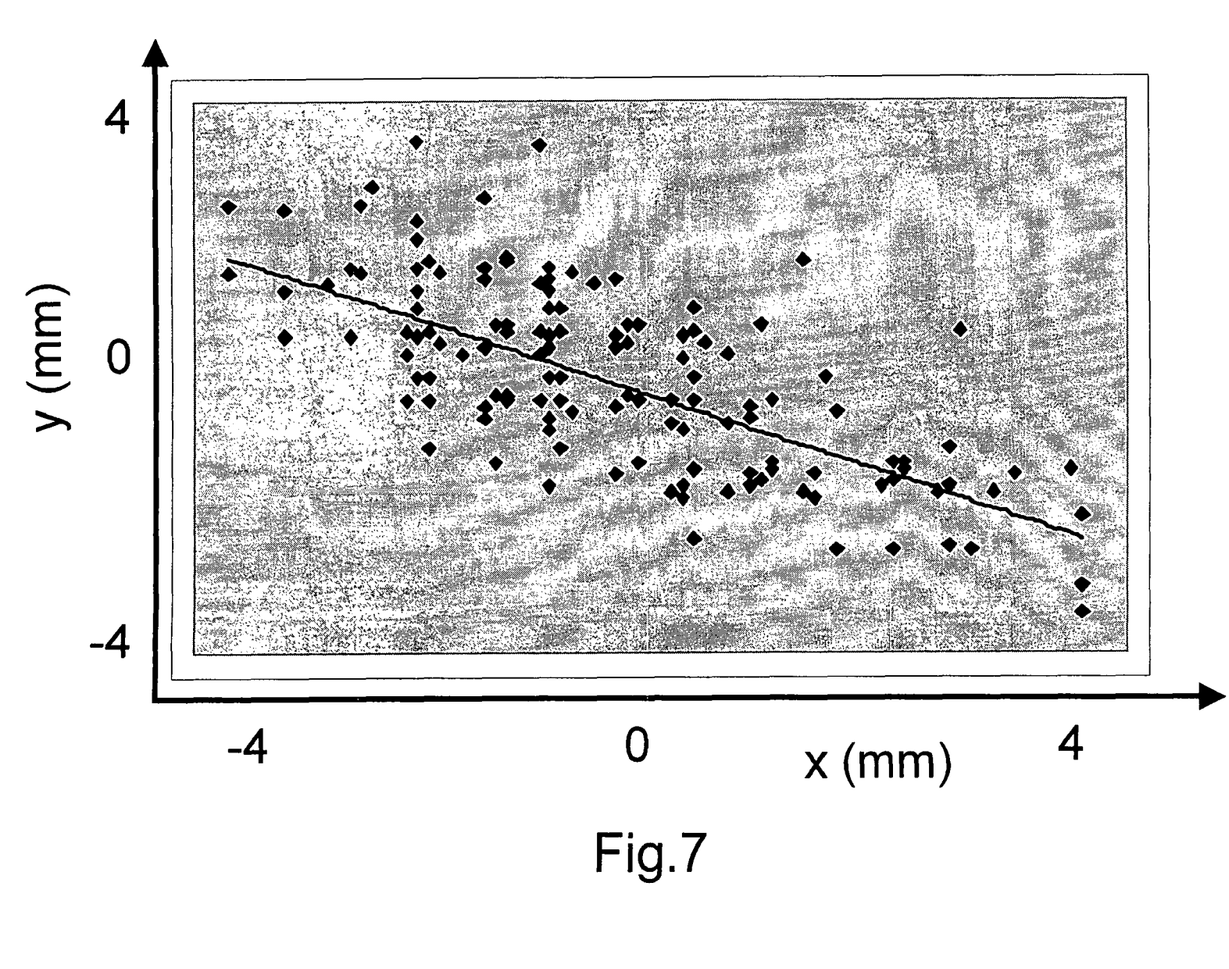

In a further embodiment, the reference data set is acquired without breath-holding by the subject. In this embodiment, the reference data set of FIGS. 2, 3, 4 and 5 are not necessarily acquired during a breath-held acquisition interval. Instead, the reference data set is selected from the free-breathing data sets. Thereafter, the steps of FIG. 3 are similarly performed using the selected reference data set that has been reconstructed. FIGS. 6 and 7 illustrate the relative spatial offsets of free-breathing data sets that have been reconstructed. FIG. 6 illustrates offsets for 9 interleaves of a 16 interleaved spiral trajectory. The points shown on FIG. 6 illustrate positions of reconstructed free-breathing data sets relative to a breath-held reference data set. As is illustrated, the positions are clustered along a line. In this embodiment, the breath-held data set is eliminated and instead a reference data set is randomly selected from the reconstructed free-breathing data. FIG. 7 shows positions of reconstructed free-breathing data relative to a randomly selected reference data set. In order to account for shift and other positional changes of the free-breathing data during imaging, the positions of the reconstructed free-breathing data sets are shifted relative to the centroid of the free-breathing data points. In order to derive a reference data set, this embodiment acquires a plurality of free-breathing data sets, reconstructs the data sets and then randomly selects a data set to serve as a reference data set. The centroid or average of all points of the reconstructed free-breathing data sets is located and then used to shift the remaining reconstructed free-breathing data points relative to the centroid. Thereafter, the comparing and averaging steps of FIG. 3 with respect to each interleaf angle is performed. Thereafter, the step of assembling and summing of the averaged interleaves for all interleaf angles is performed to generate an image of the region of interest.

Figure 8:
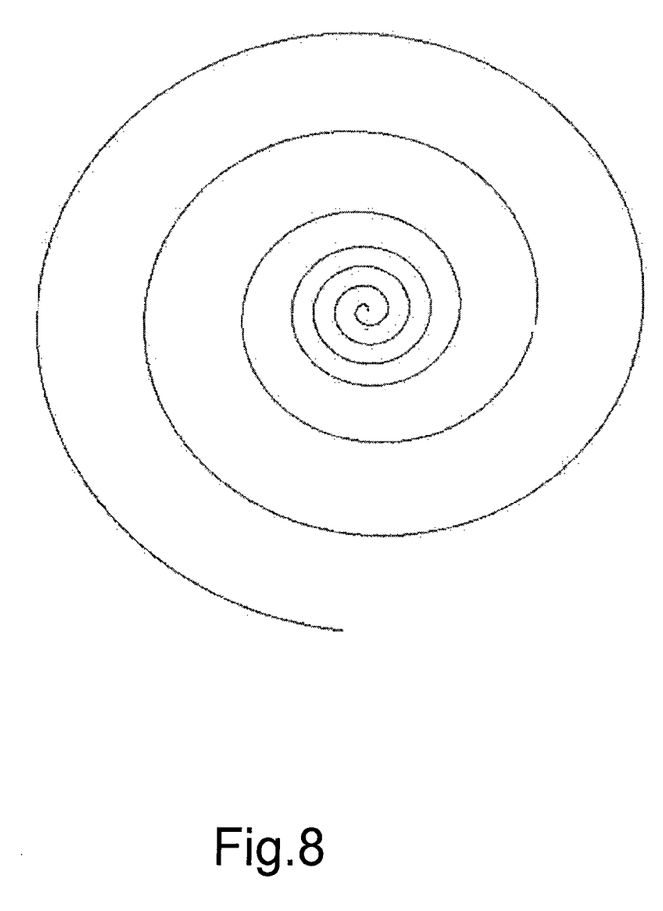

In the embodiments discussed above, a spiral trajectory of constant pitch, such as an Archimidean spiral trajectory, as shown in FIG. 2 is employed. In an alternate embodiment, a modified spiral trajectory as shown in FIG. 8 is employed. The spiral of FIG. 8 samples the center of k-space more heavily or densely than the outer portions which advantageously reduces aliasing artifacts in the sub-images. Thus, the modified spiral such as in FIG. 4 desirably enhances the reliability of the cross-correlations. It is to be appreciated that, in this embodiment, the outer region of k-space becomes less heavily sampled, and thus the higher spatial frequencies are under-represented. However, this sampling can be compensated for by increasing the number of interleaves.

While the embodiments discussed above related to coronary MR angiography, it is to be appreciated to one skilled in the art that the embodiments are also applicable to other dynamic spiral imaging applications affected by breathing or movement, for example other coronary applications, head imaging, and internal organ imaging.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for acquiring image data from a subject during a scan with a Magnetic Resonance Imaging (MRI) system comprising:

acquiring a breath-held image data set of a region of interest with spiral scanning;

acquiring a plurality of free-breathing data sets of said region of interest with spiral scanning;

comparing respective interleaves from said breath-held data set at a given interleaf angle with respective corresponding interleaves of said plurality of free-breathing data sets at said given interleaf angle to select a predetermined plurality of matched interleaves from said free-breathing data sets; and, averaging said predetermined plurality of matching interleaves for use in generating an image of said region of interest.

2. The method of claim 1 wherein said respective breath-held and free-breathing data sets comprise a plurality of acquisitions at a plurality of interleaf angles in a spiral trajectory.

3. The method of claim 2 further comprising repeating said comparing step for each interleaf angle of said spiral trajectory.

4. The method of claim 1 wherein said region of interest is a coronary artery.

5. The method of claim 1 wherein said each of said respective breath-held and free-breathing data sets are acquired by spiral trajectory scanning having a Archimidean spiral.

6. The method of claim 1 wherein said each of said respective breath-held and free-breathing data sets are acquired by spiral trajectory scanning having a modified spiral that samples the center of k-space more densely that the outer portion of k-space.

7. A method of acquiring and reconstructing an image of a dynamic region of interest using a Magnetic Resonance Imaging (MRI) system comprising:

acquiring a reference data set of a region of interest using spiral trajectory scanning;

reconstructing each respective spiral interleaf of said breath held data set for each interleaf angle of said spiral trajectory into respective complex reference sub-images;

acquiring a plurality of free-breathing data sets of said region of interest using spiral trajectory scanning;

reconstructing each respective spiral acquisition of said plurality of free-breathing data sets for each interleaf angle of said spiral trajectory into corresponding free-breathing complex sub-images;

comparing said respective breath-held and corresponding free-breathing complex sub-images to select matching acquisitions for each interleaf angle from said free-breathing data sets; and, averaging said matching acquisitions at each interleaf angle; and, assembling and summing said averaged matching acquisitions to generate an image of said region of interest.

8. The method of claim 7 wherein said region of interest is a coronary artery.

9. The method of claim 7 wherein said each of said respective breath-held and free-breathing data sets are acquired by spiral trajectory scanning having a Archimidean spiral.

10. The method of claim 7 wherein said each of said respective breath-held and free-breathing data sets are acquired by spiral trajectory scanning having a modified spiral that samples the center of k-space more densely that the outer portion of k-space.

11. A method for acquiring image data from a subject without breath-holding during a scan with a Magnetic Resonance Imaging (MRI) system comprising:

acquiring a reference data set of a region of interest during free-breathing;

acquiring a plurality of additional free-breathing data sets of said region of interest; and, selectively processing said plurality of additional free-breathing data sets in comparison with said reference data set for use in generating an image of said region of interest.

12. The method of claim 11 wherein said step of acquiring said reference data set comprises randomly selecting a reconstructed free-breathing data set.

13. The method of claim 12 further comprising the step of adjusting respective positions of said additional free-breathing data sets relative to said randomly selected reconstructed free-breathing data set.

* * * * *

UNITED STATES PATENT AND TRADEMARK OFFICE
CERTIFICATE OF CORRECTION

| | | |
|---|---|---|
| PATENT NO. | : 7,809,423 B2 | Page 1 of 1 |
| APPLICATION NO. | : 11/246725 | |
| DATED | : October 5, 2010 | |
| INVENTOR(S) | : Hardy et al. | |

It is certified that error appears in the above-identified patent and that said Letters Patent is hereby corrected as shown below:

On the Title Page, in illustrative Figure, for Tag "330", in Line 2, delete "erach" and insert -- each --, therefor.

In Fig. 3, Sheet 3 of 8, for Tag "330", in Line 2, delete "erach" and insert -- each --, therefor.

Column 1, Lines 11-12, after "INVENTION", delete "LABEL NUMBER".

Column 2, Line 44, delete "M" and insert -- MR --, therefor.

Signed and Sealed this

Thirtieth Day of November, 2010

David J. Kappos
*Director of the United States Patent and Trademark Office*